(12) United States Patent
Kim

(10) Patent No.: US 7,928,543 B2
(45) Date of Patent: *Apr. 19, 2011

(54) TAPE WIRING SUBSTRATE AND TAPE PACKAGE USING THE SAME

(75) Inventor: Dong-Han Kim, Osan-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 167 days.

This patent is subject to a terminal disclaimer.

(21) Appl. No.: 12/417,670

(22) Filed: Apr. 3, 2009

(65) Prior Publication Data

US 2009/0189274 A1    Jul. 30, 2009

Related U.S. Application Data

(63) Continuation of application No. 11/586,601, filed on Oct. 26, 2006, now Pat. No. 7,525,181.

(30) Foreign Application Priority Data

Mar. 31, 2006   (KR) .................................. 2006-29662

(51) Int. Cl.
*H01L 23/495* (2006.01)

(52) U.S. Cl. ........ 257/668; 257/671; 257/692; 257/735; 257/E23.07; 257/E23.055; 257/E23.056; 257/E23.034; 257/E21.511

(58) Field of Classification Search .................. 257/673, 257/692, 735, E23.07, E23.34, E23.055, 257/668, 671, 690, E21.511, E23.056
See application file for complete search history.

(56) References Cited

U.S. PATENT DOCUMENTS

| 6,084,291 | A | 7/2000 | Fujimori |
| 6,710,458 | B2 | 3/2004 | Seko |
| 6,867,490 | B2 | 3/2005 | Toyosawa |
| 7,042,069 | B2 | 5/2006 | Urushido |
| 7,525,181 | B2 * | 4/2009 | Kim ............................ 257/673 |
| 2005/0133912 | A1 | 6/2005 | Wu et al. |

FOREIGN PATENT DOCUMENTS

| JP | 08-316270 | 11/1996 |
| JP | 09-260579 | 3/1997 |
| JP | 1020010062045 A | 7/2001 |
| JP | 2001-332645 | 11/2001 |
| JP | 2003-023035 | 1/2003 |
| JP | 2004-247534 | 9/2004 |
| JP | 1020040080741 A | 9/2004 |
| KR | 1020040028225 A | 4/2004 |

* cited by examiner

*Primary Examiner* — Jasmine J Clark
(74) *Attorney, Agent, or Firm* — Volentine & Whitt, PLLC

(57) ABSTRACT

A tape wiring substrate may have dispersion wiring patterns. The dispersion wiring patterns may be provided between input/output wiring pattern groups to compensate for the intervals therebetween. Connecting wiring patterns may be configured to connect the dispersion wiring patterns to a first end of the adjacent input/output wiring pattern.

20 Claims, 4 Drawing Sheets

TAPE WIRING SUBSTRATE AND TAPE PACKAGE USING THE SAME

CROSS-REFERENCE TO RELATED APPLICATIONS

This is a continuation of application Ser. No. 11/586,601, filed Oct. 26, 2006, which is incorporated herein by reference in its entirety.

BACKGROUND OF THE INVENTION

1. Field of the Invention

The present invention relates to a tape package technique and, more particularly, to a tape wiring substrate with improved EMI noise characteristic and a tape package using the same.

This U.S. non-provisional application claims benefit of priority under 35 U.S.C. §119 of Korean Patent Application No. 2006-29662, filed on Mar. 31, 2006, the entire contents of which are incorporated herein by reference.

2. Description of the Related Art

With the development of the flat display industry (e.g., LCDs for portable phones, TFT LCDs for computers and PDPs for domestic use) tape packaging, which is a component of flat display devices, is a technology that is continually evolving. As the flat display devices decrease in size, the respective tape packaging requires ever finer pitch of wiring patterns.

Tape packages may use a tape wiring substrate, and include tape carrier packages (TCPs) and chip on film (COF) packages. The TCPs may include a tape wiring substrate having a window and a semiconductor chip mounted on the tape wiring substrate using an inner lead bonding method. The COF packages may include a solid tape wiring substrate and a semiconductor chip mounted on the tape wiring substrate using a flip-chip bonding method.

In the COF packages, input/output terminal patterns may act as external connection terminals, as opposed to solder balls. The input/output terminal patterns may be directly attached to a printed circuit board or a display panel. The input/output terminal patterns may include inner leads formed at one end and outer leads formed at the other end.

FIG. 1 is a plan view of a conventional tape package 100. FIG. 2 is a cross-sectional view taken along the line-II of FIG. 1. As shown in FIGS. 1 and 2, the COF package 100 may include a tape wiring substrate 40 and a semiconductor chip 10 that is "flip-chip" bonded to the tape wiring substrate 40 using electrode bumps 16 and 17. An encapsulant 50 may be used to seal the flip-chip bonded portions between the semiconductor chip 10 and the tape wiring substrate 40. The electrode bumps 16 and 17 may be used for input or output signals.

The electrode bumps 16 and 17 may be provided at a peripheral region of an active surface 12 of the semiconductor chip 10 at irregular intervals. The peripheral region of the active surface 12 of the semiconductor chip 10 may include an occupied region 13 where the electrode bumps 16 and 17 are provided, and an unoccupied region 14 where the electrode bumps 16 and 17 are not provided. The width of the unoccupied region 14 may be equal to or larger than the pitch of the electrode bumps 16 and 17.

The unoccupied region 14 may include a first unoccupied region 14a and a second unoccupied region 14b. The first unoccupied region 14a may be used to provide circuit wirings connecting the input bumps 16, and the second unoccupied region 14b may be used to provide circuit wirings connecting the output bumps 17 to test pads (not shown). The first unoccupied region 14a may be provided in the arrangement of the input bumps 16 and the second unoccupied region 14b may be provided in the arrangement of the output bumps 17. The test pads may be provided in scribe lines (not shown), i.e. areas formed between adjacent semiconductor chips.

The tape wiring substrate 40 may include a base film 20 and wiring patterns 31 and 33 provided on the base film 20. The tape wiring substrate 40 may have a wiring region 23 where the wiring patterns 31 and 33 are provided, and a non-wiring region 25 where the wiring patterns 31 and 33 are not provided. The wiring region 23 may correspond to the occupied region 13 of the semiconductor chip 10, and the non-wiring region 25 may correspond to the unoccupied region 14 of the semiconductor chip 10.

When the semiconductor chip 10 is bonded to the tape wiring substrate 40, the tape wiring substrate 40 may be deformed at the non-wiring region 25 due to thermal stresses. As a result, the input/output wiring patterns 31 and 33 near the non-wiring region 25 may be dislocated, thus leading to incorrect bonding between the input/output wiring patterns 31 and 33 and the electrode bumps 16 and 17, respectively. A wider non-wiring region 25 and finer pitches of the input/output wiring patterns 31 and 33 may result in more poor bonding faults. As shown in FIG. 2, the output wiring pattern 33 near the non-wiring region 25 may move toward the unoccupied region 14, for example distance (d1) becoming smaller than distance (d2).

To solve this problem, a semiconductor chip may have dummy bumps provided at an unoccupied region while a complementary tape wiring substrate may have respective dummy wiring patterns provided at a non-wiring region for bonding to the dummy bumps.

Although the conventional art is generally thought to provide acceptable performance, it is not without shortcomings. For example, in actual practice dummy bumps may be not connected to internal circuit wirings of a semiconductor chip and dummy wiring patterns may be not connected to input/output wiring patterns. Either situation can result in deteriorated EMI noise characteristics.

SUMMARY OF THE INVENTION

An example embodiment of the present invention is directed to improving EMI noise characteristic.

According to an example embodiment of the present invention, a tape wiring substrate includes a base film having a chip mounting area and base wiring patterns provided on the base film. The base wiring patterns includes a plurality of input and/or output (input/output) wiring patterns provided in groups at a regular interval and arranged at a regular pitch in each group, the input/output wiring patterns each having a first end arranged around the chip mounding area, at least one dispersion wiring pattern provided between the input/output wiring pattern groups, and connecting wiring patterns configured to connect the dispersion wiring patterns to the adjacent input/output wiring pattern.

According to another example embodiment, a tape package includes a tape wiring substrate that includes a base film having a chip mounting area and base wiring patterns provided on the base film. The base wiring patterns includes a plurality of input and/or output (input/output) wiring patterns provided in groups at a regular interval and arranged at a regular pitch in each group, the input/output wiring patterns each having a first end arranged around the chip mounding area, wherein the input/output wiring pattern extends to the opposing side of the base film from the chip mounting area, at least one dispersion wiring pattern provided between the input/output wiring pattern groups, and connecting wiring patterns configured to connect the dispersion wiring patterns to the adjacent input/output wiring pattern. The tape package further includes a semiconductor chip having an active surface with electrode bumps, the electrode bump being bonded to the first end of the input/output wiring pattern of the tape wiring substrate, and an encapsulant sealing the bonded portions between the semiconductor chip and the tape wiring substrate.

In yet another example embodiment, a tape package includes a tape wiring substrate, a semiconductor chip having an active surface with electrode bumps arranged in groups at a regular interval in a peripheral region with the semiconductor chip bonded to the tape wiring substrate using the electrode bumps, and an encapsulant sealing the bonded portions between the semiconductor chip and the tape wiring substrate. The tape wiring substrate includes a base film having a chip mounting area, input/output wiring patterns provided on the base film and having first end arranged around the chip mounting area and bonded to the electrode bumps of the semiconductor chip, and dispersion wiring patterns provided on the base film corresponding to areas between the electrode bump groups and connected to the first end of the adjacent input/output wiring pattern.

In still another example embodiment, a tape package includes a tape wiring substrate, and a semiconductor chip having an active surface with electrode bumps arranged in a peripheral region at an irregular interval, the semiconductor chip being bonded to the tape wiring substrate using the electrode bumps. The tape wiring substrate includes a base film having a chip mounting area, input/output wiring patterns provided on the base film and having first end arranged around the chip mounting area at an irregular interval corresponding to the electrode bumps of the semiconductor chip and bonded to the electrode bump of the semiconductor chip, dispersion wiring patterns provided between the first end of the input/output wiring patterns to compensate for the intervals between the first end of the input/output wiring pattern, and connecting wiring patterns configured to connect the dispersion wiring patterns to the first end of the adjacent input/output wiring pattern.

BRIEF DESCRIPTION OF THE DRAWINGS

The example embodiments of the present invention will be readily understood with reference to the following detailed description thereof provided in conjunction with the accompanying drawings, wherein like reference numerals designate like structural elements.

Figure 1:
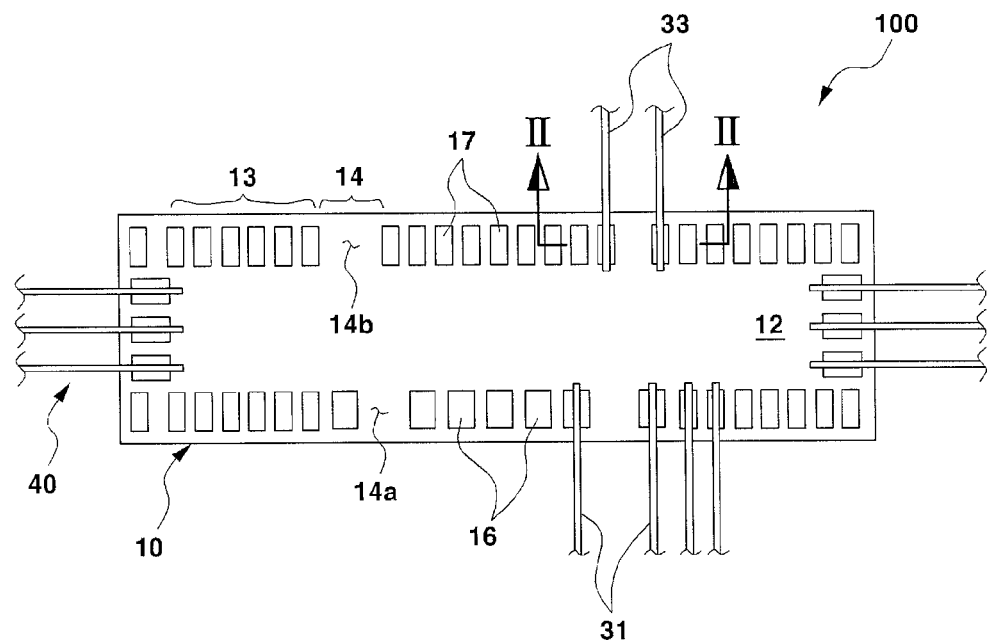
FIG. 1 is a plan view of a conventional tape package.
Figure 2:
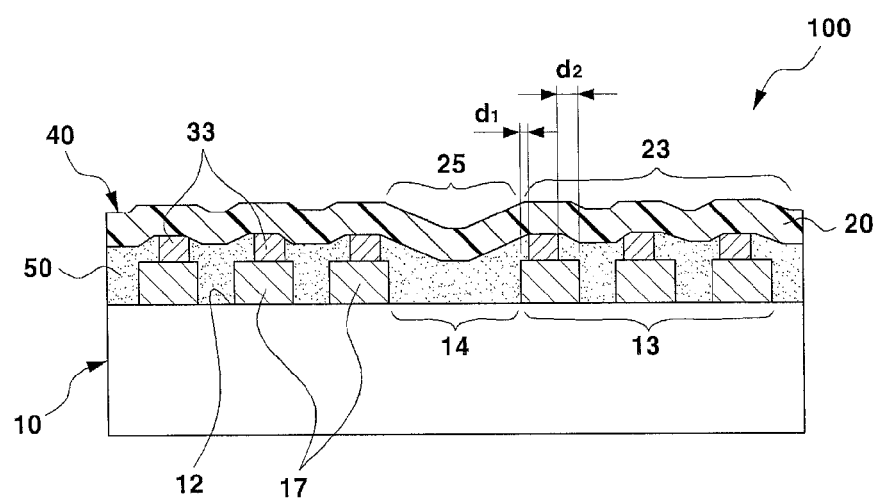
FIG. 2 is a cross-sectional view taken along the line-of FIG. 1.

These drawings are for illustrative purposes only and are not drawn to scale. The spatial relationships and relative sizing of the elements illustrated in the various embodiments may have been reduced, expanded or rearranged to improve the clarity of the figures with respect to the corresponding description. The figures, therefore, should not be interpreted as accurately reflecting the relative sizing or positioning of the corresponding structural elements that could be encompassed by an actual device manufactured according to the example embodiments of the invention.

DETAILED DESCRIPTION OF THE EXAMPLE EMBODIMENTS

Example, non-limiting embodiments of the present invention will now be described more fully hereinafter with reference to the accompanying drawings. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. The principles and features of this invention may be employed in varied and numerous embodiments without departing from the scope of the invention.

It should be noted that the figures are intended to illustrate the general characteristics of methods and devices of example embodiments of this invention, for the purpose of the description of such example embodiments herein. These drawings are not, however, to scale and may not precisely reflect the characteristics of any given embodiment, and should not be interpreted as defining or limiting the range of values or properties of example embodiments within the scope of this invention. Rather, for simplicity and clarity of illustration, the dimensions of some of the elements are exaggerated relative to other elements.

Further, well-known structures and processes are not described or illustrated in detail to avoid obscuring the present invention. Like reference numerals are used for like and corresponding parts of the various drawings.

Figure 3:
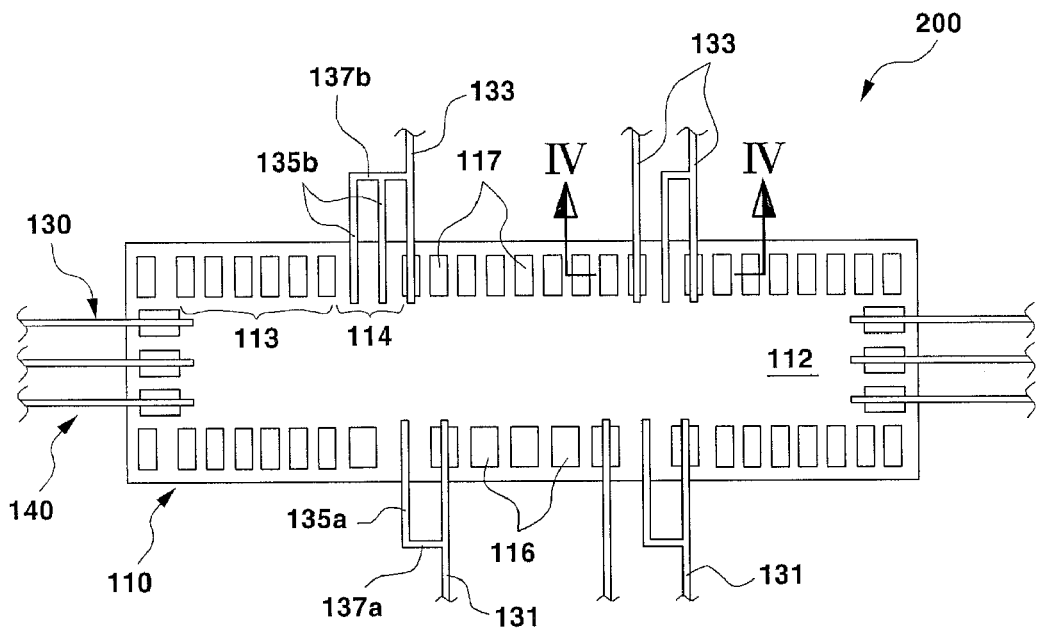
FIG. 3 is a plan view of a tape package in accordance with an example embodiment of the present invention.
Figure 4:
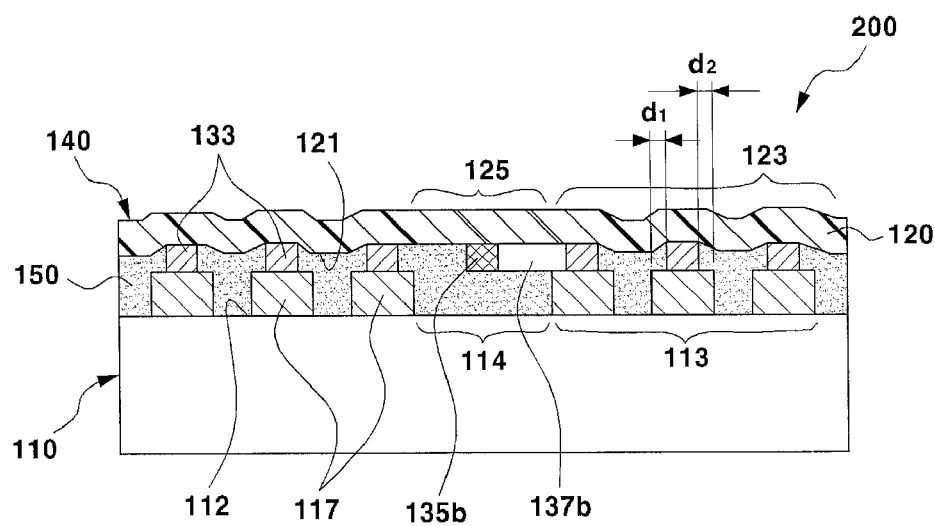
FIG. 4 is a cross-sectional view taken along the line-of FIG. 3.

FIG. 3 is a plan view of a tape package 200 in accordance with an example embodiment of the present invention. FIG. 4 is a cross-sectional view taken along the line-of FIG. 3. As shown in FIGS. 3 and 4, the tape package 200 may include a tape wiring substrate 140 and a semiconductor chip 110 flip-chip bonded to the tape wiring substrate 140 using electrode bumps 116 and 117. An encapsulant 150 may be used to seal the flip-chip bonded portions between the semiconductor chip 110 and the tape wiring substrate 140.

One or more dispersion wiring patterns 135a and 135b may be connected to adjacent input/output wiring patterns 131 and 133, respectively, which may reduce the conventional problem associated with EMI noise characteristic.

The semiconductor chip 110 may have an active surface 112 with the electrode bumps 116 and 117. The active surface 112 may be formed in the shape of a rectangle with two relatively longer opposing sides. The electrode bumps 116 and 117 may include input bumps 116 and output bumps 117. The input bumps 116 may be arranged at the center of one longer side of the active surface 112. The output bumps 117 may be arranged at the remaining peripheral region of the active surface 112 except for the input bump formation area.

The active surface 112 may have occupied regions 113 where the electrode bumps 116 and 117 are provided, and unoccupied regions 114 where the electrode bumps 116 and 117 are not provided. The unoccupied regions 114 may be provided between the occupied regions 113. The electrode bumps 116 and 117 in each occupied region 113 may be arranged at a regular pitch. The width of the unoccupied region 114 may be in multiple proportion to the pitch of the electrode bumps 116 and 117. For example, the width of the unoccupied region 114 where the input bumps 116 are not provided may be twice the pitch of the input bumps 116, and the width of the unoccupied region 114 where the output bumps 117 are not provided may be twice the pitch of the output bumps 117. Thereby, the dispersion wiring patterns 135a and 135b may be arranged in conformity with the pitch of the input/output wiring patterns 131 and 133, respectively.

The tape wiring substrate 140 may include a base film 120 and wiring patterns 130 provided on the base film 120. The wiring patterns 130 may include input wiring patterns 131 and output wiring patterns 133. The wiring patterns 130 may be formed by patterning a metal layer on the base film. The base film 120 may have a chip mounting area at the center thereof. The base film 120 may have a wiring region 123 where the input/output wiring patterns 131 and 133 are provided as well as a non-wiring region 125 where the input/output wiring patterns 131 and 133 are not provided. The base film 120 may be formed from an insulating synthetic resin, such as a polyimide resin, an acrylic resin, a polyether-nitrile resin, a polyether-sulfone resin, a polyethylene terephthalate resin, a polyethylene naphthalate resin or a polyvinyl chloride resin.

The wiring patterns 130 may be formed by forming a Cu (or some other conductor) foil on one surface of the base film 120 and patterning the Cu foil using a photographic process. The wiring patterns 130 may include the input/output wiring patterns 131 and 133, dispersion wiring patterns 135a and 135b, and connecting wiring patterns 137a and 137b. The input/output wiring patterns 131 and 133 may extend to the opposing sides of the base film 120 from the chip mounting area, and may have one end arranged around the chip mounting area and the other end opposite to one end. The one ends of the input/output wiring patterns 131 and 133 may be provided in groups at a regular interval and arranged at a regular pitch in each group. The pitch of the one end of the input/output wiring patterns 131 and 133 may correspond to the pitch of the electrode bumps 116 and 117, respectively.

The input wiring pattern 131 may extend to one side of the base film 120 from the chip mounting area and be connected to a printed circuit board, and the output wiring pattern 133 may extend to the other side of the base film 120 from the chip mounting area and be connected to a panel.

The dispersion wiring pattern 135a and 135b may be provided at the non-wiring area 125. The width of the non-wiring region 125 may be in multiple proportion to the pitch of the one end of the input/output wiring pattern 131 and 133. The pitch of the dispersion wiring patterns 135a and 135b may be equal to the pitch of the one end of the input/output wiring pattern 131 and 133, respectively. The length of the dispersion wiring patterns 135a and 135b may be shorter than the length of the input/output wiring pattern 131 and 133, and may be equal to the length of the one end of the adjacent input/output wiring pattern 131 and 133. The dispersion wiring patterns 135a and 135b may be configured to compensate for the irregular arrangement of the input/output wiring patterns 131 and 133, which may disperse thermal stresses applied to the non-wiring region 125 during bonding of the semiconductor chip 110 to the tape wiring substrate 140, and thus provide improved bonding between the input/output wiring pattern 131 and 133 and the electrode bumps 116 and 117 of the semiconductor chip 110. As shown in FIG. 4, the output wiring pattern 133 near the non-wiring region 125 may be bonded to the center of the output bump 117, for example distance (d1) being equal to distance (d2).

The connecting wiring patterns 137a and 137b may be configured to connect the dispersion wiring patterns 135a and 135b to the one end of the adjacent input/output wiring pattern 131 and 133, respectively. Here, the adjacent input/output wiring patterns 131 and 133 may be the input/output wiring pattern adjacent to one side of the dispersion wiring patterns 135a and 135b. By virtue of the connecting wiring patterns 137a and 137b, the dispersion wiring patterns 135a and 135b may be connected to the input/output wiring patterns 131 and 133, thereby reducing the likelihood of faults associated with EMI noise characteristic. Note that the connecting wiring patterns 137a and 137b may connect the dispersion wiring pattern 135a and 135b to the one end of the input/output wiring pattern 131 and 133, respectively.

The dispersion wiring patterns 135a and 135b may include a first dispersion wiring pattern 135a between the input wiring patterns 131 and a second dispersion wiring pattern 135b between the output wiring patterns 133. The connecting wiring patterns 137a and 137b may include a first connecting wiring pattern 137a configured to connect the first dispersion wiring pattern 135a to the adjacent input wiring pattern 131 and a second connecting wiring pattern 137b configured to connect the second dispersion wiring pattern 135b to the adjacent output wiring pattern 133. The wiring patterns 130 may be formed from any materials having good electrical conductivity, such as Cu, Ni, Au, solder or an alloy thereof. The wiring patterns 130 may be provided on one surface or two surfaces of the base film 120.

Note that the encapsulant 150 may be configured to protect the flip-chip bonded portions between the semiconductor chip 110 and the tape wiring substrate 140 using an underfill process.

Figure 5:
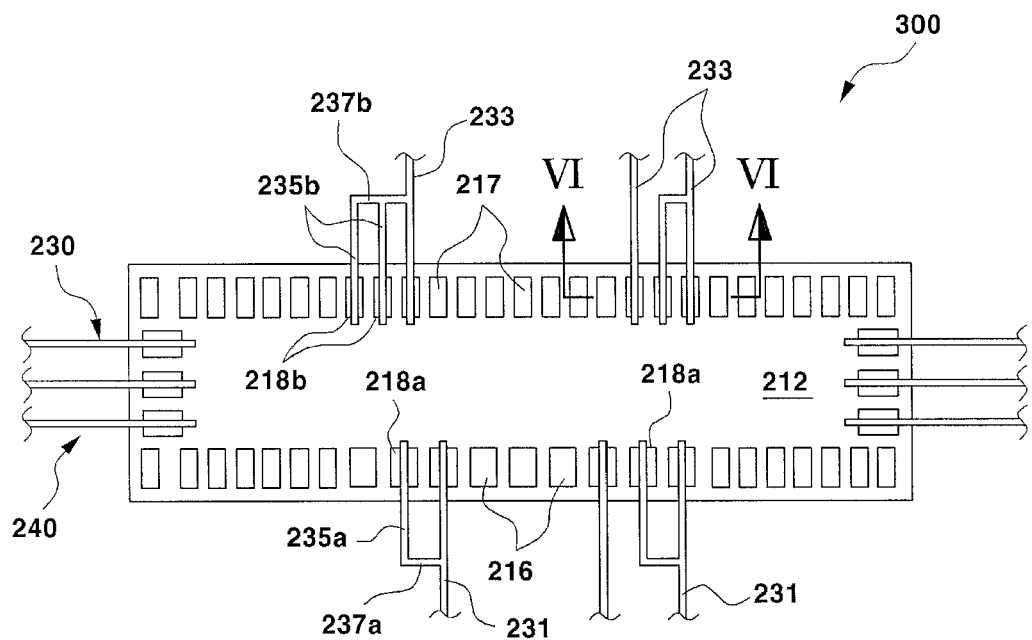
FIG. 5 is a plan view of a tape package in accordance with another example embodiment of the present invention.
Figure 6:
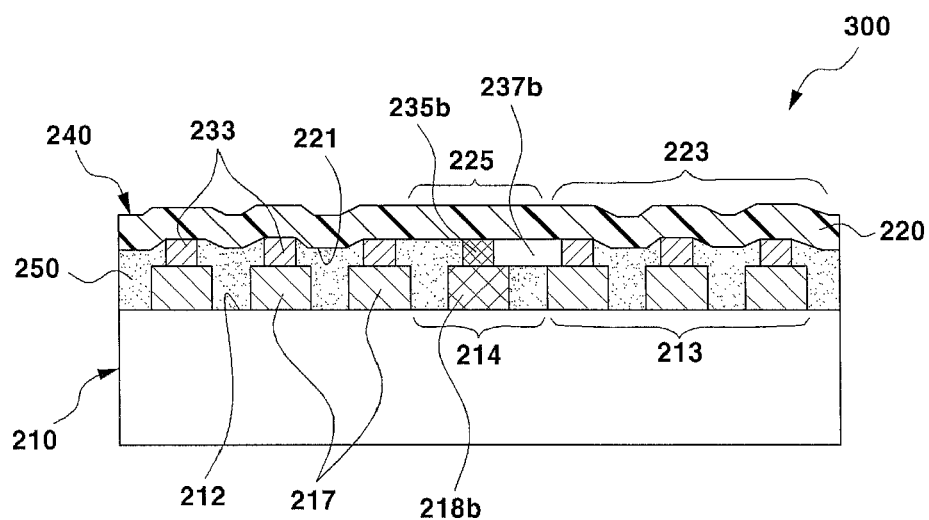
FIG. 6 is a cross-sectional view taken along the line-of FIG. 5.

FIG. 5 is a plan view of a tape package 300 in accordance with another example embodiment of the present invention. FIG. 6 is a cross-sectional view taken along the line-of FIG. 5. As shown in FIGS. 5 and 6, the tape package 300 of this example embodiment is similar to the tape package 200 of the above embodiment, but includes dispersion bumps 218a and 218b. In various embodiments, the pitch of the dispersion bumps 218a and 218b may be equal to the pitch of electrode bumps 216 and 217, respectively. Note that the dispersion bumps 218a and 218b may or may not be connected to internal circuit wirings of a semiconductor chip 210. Dispersion wiring patterns 235a and 235b may be bonded to the dispersion bumps 218a and 218b.

One end of input/output wiring patterns 231 and 233 and the dispersion wiring patterns 235a and 235b may be arranged around a chip mounting area 221 at a regular interval. This end of the input/output wiring patterns 231 and 233 may be flip-chip bonded to the electrode bumps 216 and 217 while the dispersion wiring patterns 235a and 235b may be flip-chip bonded to the dispersion bumps 218a and 218b. By using this approach, thermal stresses applied to a non-wiring region during bonding of the semiconductor chip 210 to the tape wiring substrate 240 may be dispersed, and thus providing improved bonding between the one end of the input/output wiring patterns 231 and 233 and the electrode bumps 216 and 217. Accordingly, the tape package 300 may reduce the likelihood of faults associated with EMI noise characteristic. Note that in various embodiments, the dispersion bumps 218a and 218b may be connected to a ground circuit of a semiconductor chip.

Figure 7:
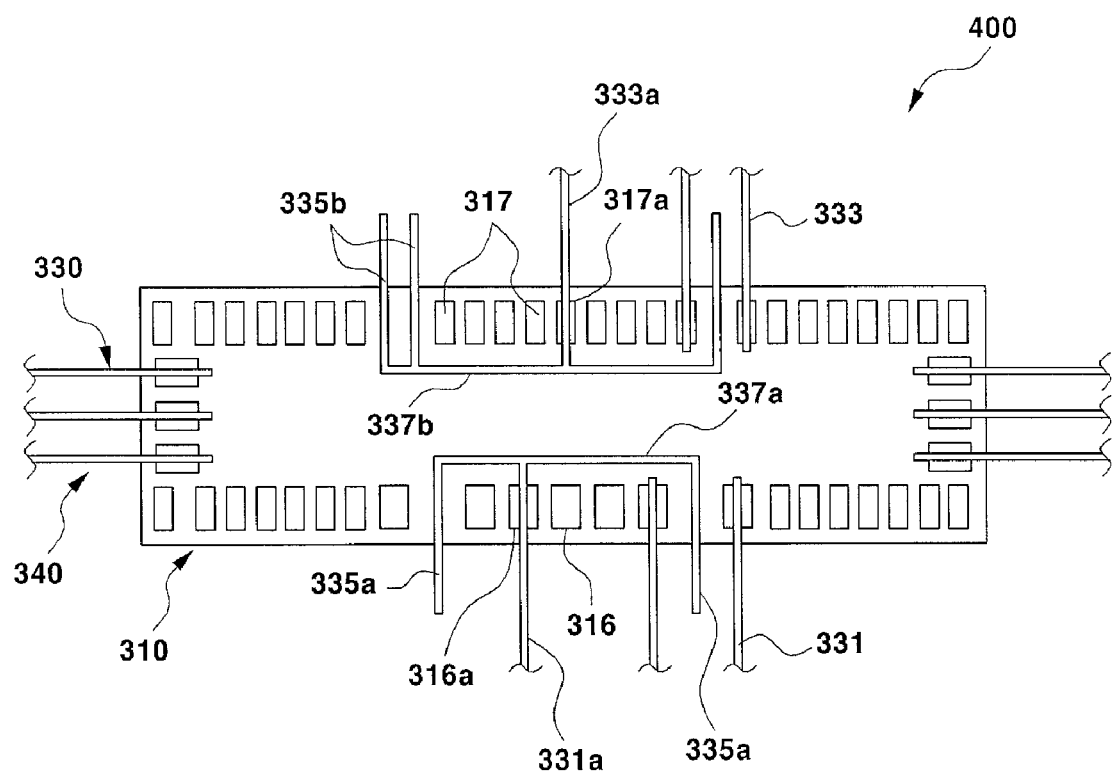
FIG. 7 is a plan view of a tape package in accordance with another example embodiment of the present invention.

FIG. 7 is a plan view of a tape package 400 in accordance with another example embodiment of the present invention.

The tape package 400 may include a tape wiring substrate 340 and a semiconductor chip 310 flip-chip bonded to the tape wiring substrate 340 using electrode bumps 316 and 317. Dispersion wiring patterns 335a and 335b of wiring patterns 330 may be connected to ground wiring patterns 331a and 333a of input/output wiring patterns 331 and 333 using connecting wiring patterns 337a and 337b, respectively. The input wiring pattern 331 and the output wiring pattern 333 may each have at least one ground wiring pattern 331a and 333a and power wiring pattern (not shown).

A first dispersion wiring pattern 335a may be connected to the ground wiring pattern 331a of the input wiring pattern 331 using a first connecting wiring pattern 337a. A second dispersion wiring pattern 335b may be connected to the ground wiring pattern 333a of the output wiring pattern 333 using a second connecting wiring pattern 337b. The connecting wiring patterns 337a and 337b may be formed in the chip mounting area 321 to connect the dispersion wiring patterns 335a and 335b to the ground wiring patterns 331a and 333a, respectively. The ground wiring patterns 331a and 333a may be bonded to ground bumps 316a and 317a of the electrode bumps 316 and 317, respectively. Although not shown, dispersion bumps bonded to the dispersion wiring patterns 335a and 335b may be provided in the semiconductor chip 310.

Although example, non-limiting embodiments of the present invention have been described in detail hereinabove, it should be understood that many variations and/or modifications of the basic inventive concepts taught herein, which may appear to those skilled in the art, will still fall within the spirit and scope of the example embodiments of the present invention as defined in the appended claims.

What is claimed is:

1. A tape wiring substrate for use in a chip package, the tape substrate including:
   a base film having a chip mounting area dedicated to receive a chip of the chip package; and
   base wiring extending along a surface of the base film, the base wiring including a plurality of input and/or output (input/output) wiring for use in transmitting input and/or output signals to and/or from a chip when the chip is mounted on the chip mounting area of the base film, each of the input and/or output wiring having a group of leads, the leads being spaced from one another at a regular pitch in each group, and the leads having first ends, respectively, disposed alongside the chip mounting area, and
   dispersion wiring pattern having at least one respective lead interposed between the groups of leads of an adjacent pair of the input/output wiring.

2. The substrate of claim 1, wherein the interval between the adjacent pair of input/output wiring is a multiple of the pitch of the first ends of the leads of the input/output wiring in each group.

3. The substrate of claim 2, wherein the dispersion wiring pattern has several respective leads interposed between the group of leads of an adjacent pair of the input/output wiring, and the pitch of the respective leads of the dispersion wiring pattern is equal to the pitch of the first ends of the leads of the input/output wiring in each group.

4. The substrate of claim 1, wherein the leads of the dispersion wiring pattern are respectively shorter than the leads of the input/output wiring.

5. The substrate of claim 1, wherein the each of the input/output wiring extends to a side of the base film opposite the chip mounting area.

6. The substrate of claim 1, wherein the lead of one of the groups of leads of an adjacent pair of the input/output wiring is a ground and/or power (ground/power) wiring pattern.

7. The substrate of claim 6, wherein the input and/or output wiring include adjacent input wiring each having a group of leads through which signals are transmitted to a chip when the chip is mounted on the chip mounting area of the base film, and adjacent output wiring each having a group of leads though which signals are transmitted from a chip when the chip is mounted on the chip mounting area of the base film, and the dispersion wiring pattern includes at least one first respective lead interposed between the group of leads of the adjacent input wiring, and at least one second respective lead interposed between the groups of leads of the adjacent output wiring.

8. The substrate of claim 7, wherein the leads of one of the input wiring and the leads of one of the output wiring each includes at least one ground/power wiring pattern, and the at least one first-respective lead of the dispersion wiring pattern is connected to the ground/power wiring pattern of said one of the input wiring, and the at least second respective lead of the dispersion wiring pattern is connected to the ground/power wiring pattern of said one of the output wiring.

9. A tape package comprising:
   a tape wiring substrate that includes:
   a base film having a chip mounting area; and
   base wiring extending along a surface of the base film, the base wiring including a plurality of input and/or output (input/output) wiring, each of the input and/or output wiring having a group of leads, the leads being spaced from one another at a regular pitch in each group, and the leads having first ends, respectively, disposed alongside the chip mounting area, wherein each of the input/output wiring extends to a side of the base film opposite the chip mounting area; and
   dispersion wiring pattern having at least one respective lead interposed between the groups of leads of an adjacent pair of the input/output wiring;
   a semiconductor chip disposed on the chip mounting area of and mounted to the tape substrate, the semiconductor chip having an active surface with electrode bumps, the electrode bumps being respectively bonded to the first ends of the leads of the input/output wiring of the tape wiring substrate; and
   an encapsulant sealing a region at which the semiconductor chip and the tape wiring substrate are bonded to each other via the bumps and the first ends of the leads of the input/output wiring.

10. The package of claim 9, wherein the semiconductor chip further has dispersion bumps on the active surface, the dispersion bumps being bonded to the dispersion wiring pattern of the tape wiring substrate.

11. The package of claim 10, wherein the lead of one of the groups of leads of an adjacent pair of the input/output wiring of the tape wiring substrate is a ground and/or power (ground/power) wiring pattern.

12. The package of claim 11, wherein the input and/or output wiring of the tape wiring substrate include adjacent input wiring each having a group of leads through which signals are transmitted to the semiconductor chip, and adjacent output wiring each having a group of leads through which signals are transmitted from the semiconductor chip, and the dispersion wiring of the tape wiring substrate includes at least one first respective lead interposed between the groups of leads of the adjacent input wiring, and at least one second respective lead interposed between the group of leads of the adjacent output wiring.

13. The package of claim 12, wherein the leads of one of the input wiring of the tape wiring substrate and the leads of one of the output wiring each includes at least one ground/power wiring pattern, and the at least one first-respective lead of the dispersion wiring pattern of the tape wiring substrate is connected to the ground/power wiring pattern of said one of the input wiring, and the at least one second respective lead of the dispersion wiring pattern is connected to the ground/power wiring pattern of said one of the output wiring.

14. A tape package comprising:
a tape wiring substrate; and
a semiconductor chip having an active surface with electrode bumps, the electrode bumps being arranged in groups at a peripheral region of the semiconductor chip, the groups of electrode bumps being spaced from each other at irregular intervals, and the semiconductor chip being bonded to the tape wiring substrate via the electrode bumps, and
wherein the tape wiring substrate includes;
a base film having a chip mounting area on which the semiconductor chip is disposed;
at least two adjacent pairs of input/output wiring extending along a surface of the base film, each of the input output wiring comprising a plurality of leads, the leads of each of the input/output wiring having first ends, respectively, disposed in a group alongside the chip mounting area, the groups of the first ends of the leads of the input/output wiring being spaced from each other at irregular intervals corresponding to the irregular intervals at which the groups of the electrode bumps of the semiconductor chip are spaced from one other, and the first ends of the leads of the input/output wiring being bonded to the electrode bumps of the semiconductor chip, respectively;
dispersion wiring pattern extending along the surface of the base film, the dispersion wiring pattern comprising at least one respective lead interposed between the groups of the first ends of each adjacent pair of the input/output wiring to compensate for the irregularity of the intervals between the groups of the first ends of the leads of the input/output wiring.

15. The package of claim 14, wherein the first ends of the groups of leads of each of the input/output wiring are spaced from one other at a regular pitch.

16. The package of claim 14, wherein the number of leads of the dispersion wiring pattern interposed between the groups of the first ends of the leads of one of the adjacent pairs of the input/output wiring is different from the number of leads of the dispersion wiring pattern interposed between the groups of the first ends of the leads of another of the adjacent pairs of the input/output wiring.

17. The package of claim 16, wherein the first ends of the groups of leads of each of the input/output wiring are spaced from one other at a regular pitch.

18. The substrate of claim 1, wherein the plurality of input and/or output (input/output) wiring comprises at least two adjacent pairs of input/output wiring provided on the base film, the first ends of the leads of each of the input/output wiring being disposed in a groups alongside the chip mounting area, and the groups of the first ends of the leads of the input/output wiring being spaced from each other at irregular intervals, and
the dispersion wiring pattern has at least one respective lead interposed between the groups of the first ends of the leads of each adjacent pair of the input/output wiring, the dispersion wiring pattern compensating for the irregularity of the intervals between the groups of the first ends of the leads of the input/output wiring.

19. The substrate of claim 18, wherein the number of leads of the dispersion wiring pattern interposed between the groups of the first ends of the leads of one of the adjacent pairs of the input/output wiring is different from the number of leads of the dispersion wiring pattern interposed between the groups of the first ends of the leads of another of the adjacent pairs of the input/output wiring.

20. The substrate of claim 1, wherein the input/output wiring are not connected to dispersion wiring.

* * * * *